United States Patent

Bashir et al.

[11] Patent Number: 5,930,635
[45] Date of Patent: Jul. 27, 1999

[54] COMPLEMENTARY SI/SIGE HETEROJUNCTION BIPOLAR TECHNOLOGY

[75] Inventors: Rashid Bashir, Santa Clara; Francois Hebert, Sunnyvale, both of Calif.

[73] Assignee: National Semiconductor Corporation, Santa Clara, Calif.

[21] Appl. No.: 08/850,610

[22] Filed: May 2, 1997

[51] Int. Cl.⁶ .................................................. H01L 21/331
[52] U.S. Cl. .......................................... 438/313; 438/309
[58] Field of Search ..................... 438/312, 313, 438/309, 316, 317, 322, 323, 325, 340, 341, 350, 489

[56] References Cited

U.S. PATENT DOCUMENTS

| 4,951,115 | 8/1990 | Harame et al. . | |
| 4,997,776 | 3/1991 | Harame et al. . | |
| 5,262,335 | 11/1993 | Streit et al. | 438/313 |
| 5,369,042 | 11/1994 | Morris et al. | 438/313 |
| 5,439,833 | 8/1995 | Hebert et al. . | |
| 5,807,780 | 9/1998 | Davis et al. | 438/311 |

OTHER PUBLICATIONS

Wolf, S. "Bipolar and Bicmos Process Integration, Section 7.13 Complementary Bipolar (CB) Tecnology," *Silicon Processing for the VLSI ERA—vol. 11*, pp. 557–560, (1990).

*Primary Examiner*—Tuan H. Nguyen
*Attorney, Agent, or Firm*—Limbach & Limbach L.L.P.

[57] ABSTRACT

A method of manufacturing truly complementary bipolar transistors on a common substrate. The method results in the fabrication of vertical NPN and PNP transistors which have an identical structure and mode of operation, with both devices operating in the downward direction. The inventive method permits independent control of the characteristics of the two devices, producing a closely matched performance for both devices.

22 Claims, 6 Drawing Sheets

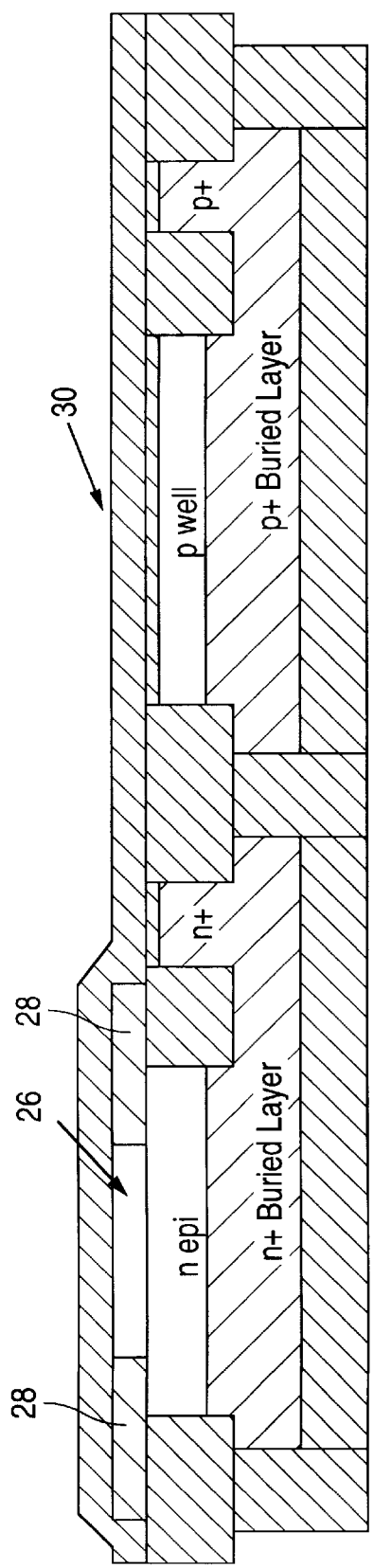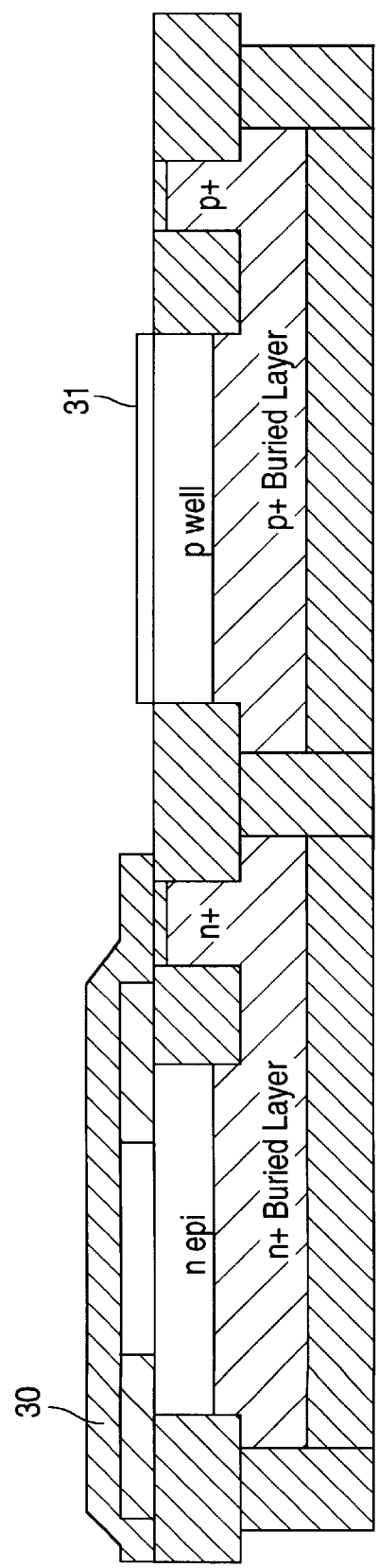
FIG. 1(c)
FIG. 1(d)

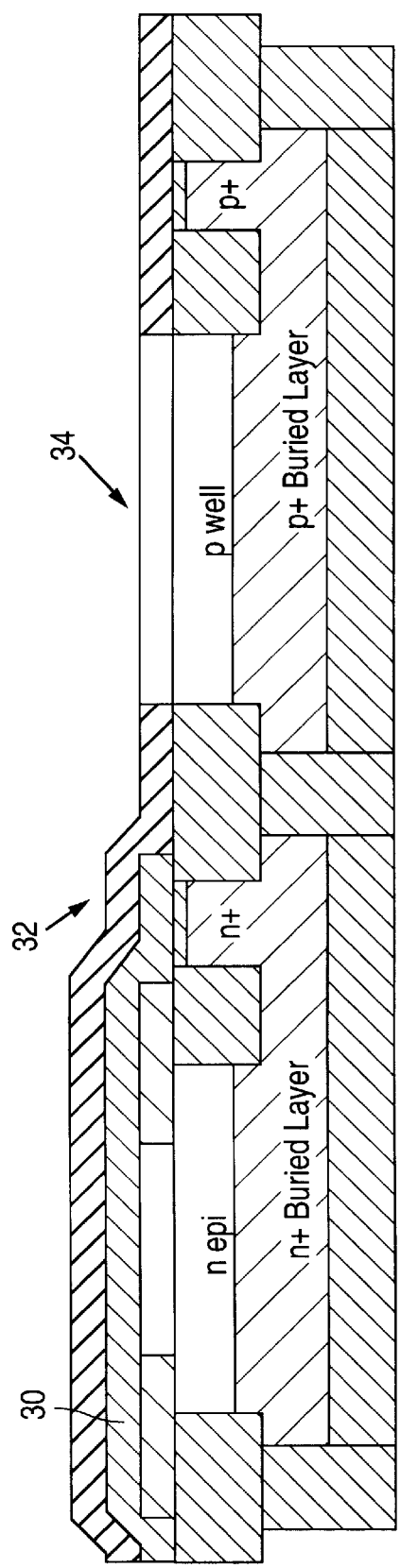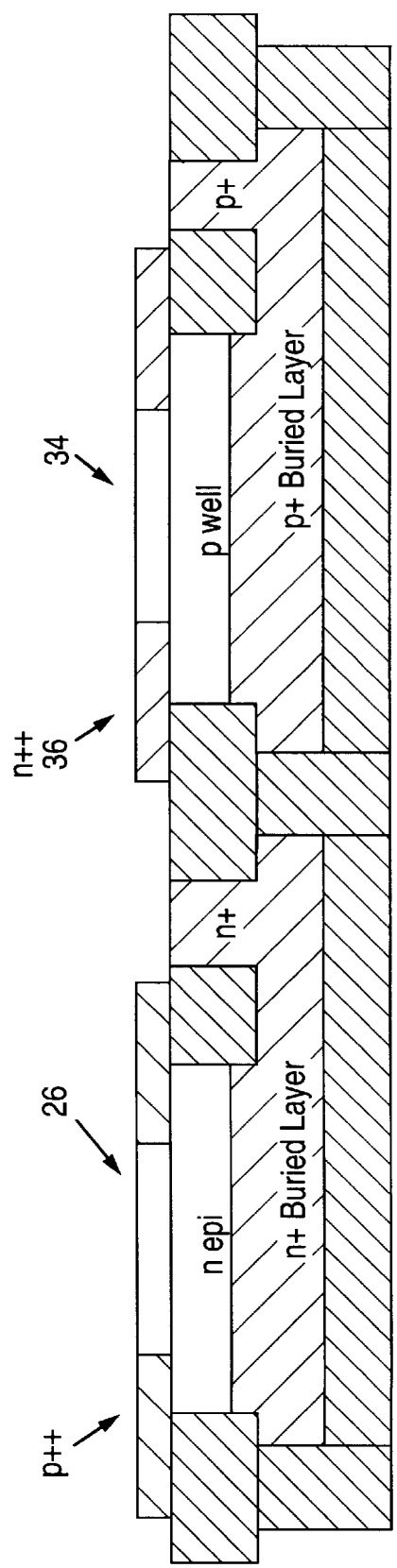
FIG. 1(e)
FIG. 1(f)

COMPLEMENTARY SI/SIGE HETEROJUNCTION BIPOLAR TECHNOLOGY

TECHNICAL FIELD

The present invention is directed to processes for fabricating complementary vertical NPN and PNP bipolar transistors using epitaxial/deposited base technologies, and more specifically, to a method for making a truly complementary bipolar device on a common substrate where both the NPN and PNP transistors are identical in structure and operate in the same direction.

BACKGROUND OF THE INVENTION

The fabrication of complementary bipolar (CB) transistors on a common substrate is of great interest in the production of both analog and digital circuits. Digital circuits based on CB technology offer the possibility of high-speed performance coupled with little dissipation of standby power. Analog circuits based on CB technology offer high-speed, substrate isolated PNP transistors, capacitor structures, low and high sheet resistance resistors, and the ability to provide precision matching of components.

It has been a continuing technological challenge to integrate vertical PNP devices into a high performance NPN process without significantly degrading the performance of the NPN device. This is essential for high performance, low noise, and high frequency applications.

U.S. Pat. No. 4,951,115 issued Aug. 21, 1990, and U.S. Pat. No. 4,997,776 issued Mar. 5, 1991, naming Harame et al. as inventors, disclose a complementary bipolar transistor structure and a method of manufacturing the same. The transistor structure includes a vertical NPN transistor operating in the upward direction and a vertical PNP transistor operating in the downward direction. A stacked N-type/P-type base layer is used to form the base regions for both the NPN and PNP devices. This causes the base-collector junction of both transistors to have the same vertical profile.

The complementary bipolar transistor manufacturing method described in the '115 and '776 patents produces vertical NPN and PNP devices having closer performance characteristics than many other methods discussed in the art. However, the resulting devices still differ in some respects, and thus are not truly complementary. For example, the NPN and PNP transistors differ in structure and mode of operation (current flow direction). Furthermore, the performance of the NPN device is compromised relative to the PNP device because the NPN base/emitter area is much larger than the PNP device base/emitter area.

A common problem to many of the complementary transistor fabrication methods discussed in the art is that the mode of operation of the two devices is different, i.e., one operates in an upward direction and the other operates in a downward direction. This is a result of the order in which the material layers which form the emitter, base, and collector regions for the two devices are deposited and implanted with dopants. This asymmetry in the operation of the two devices, combined with the difference in transistor structure, produces a difference in the performance of the two devices.

Another problem inherent to most methods of fabricating complementary bipolar devices is that the methods lack the ability to independently control the characteristics of the transistors. For example, because the emitter of one transistor is formed from the same layer as the collector of the other transistor, it is not possible to independently optimize the parameters of the two regions to obtain the highest and most closely matched performance for the two devices. This leads to a compromising of the performance of the NPN transistor.

What is desired is a method for manufacturing truly complementary bipolar transistors on a common substrate. It is desired that the two devices have an identical structure and mode of operation, and that the performance of the two devices be closely matched so that they may be used for high performance, low noise, and high frequency applications. It is also desired that the manufacturing process flow be such that the characteristics of the two transistors can be independently controlled and optimized. These and other advantages of the present invention will be apparent to those skilled in the art upon a reading of the Detailed Description of the Invention together with the drawings.

SUMMARY OF THE INVENTION

The present invention is directed to a method of manufacturing truly complementary bipolar transistors on a common substrate. The method results in the fabrication of vertical NPN and PNP transistors which have an identical structure and mode of operation, with both devices operating in the downward direction. The inventive method permits independent control of the characteristics of the two devices, producing a closely matched performance for both devices. The method utilizes an epitaxial growth process to form the base regions of the devices from a silicon-germanium alloy. This provides better control of film thickness and composition, enabling the production of high speed NPN and PNP devices having a desired doping profile.

The process begins by defining and forming sinker, well, and buried layer regions in a substrate. Isolation structures are then formed. A layer of oxide is then deposited over the surface of the substrate. The NPN device base region is than opened by etching the oxide layer. A P+ doped silicon-germanium (SiGe) base region stack is then epitaxially grown over the surface of the substrate. The stack is formed from an intrinsic or doped silicon layer arranged over an undoped SiGe layer, which is arranged over a layer of P+ doped SiGe. Boron is then implanted into the SiGe layer in the extrinsic base contact regions for the NPN device. A mask is then used to permit etching of the P+ SiGe stack and its removal from those regions of the substrate surface which are not part of the NPN device. A layer of oxide is then deposited over the substrate. The oxide layer is masked and etched to remove it from the region where the PNP device is to be formed. A low temperature etch process is then used to remove the native oxide formed on the substrate surface in the PNP device region prior to growth of the PNP base region layers. The low temperature process prevents relaxation of the NPN base region layers and diffusion of the dopant out of the layers.

After the low temperature pre-clean of the PNP base region, an N+ doped silicon-germanium base region stack is epitaxially grown over the surface of the substrate. The stack is formed from an intrinsic or doped silicon layer arranged over an undoped SiGe layer, which is arranged over a layer of N+ doped SiGe. Phosphorus is then implanted into the SiGe layer in the extrinsic base contact regions for the PNP device. A mask is used to permit etching of the N+ SiGe stack and its removal from those regions of the substrate surface which are not part of the PNP device. The oxide layer covering the P+ SiGe layer is then etched. A layer of oxide is then deposited over the surface of the substrate. Emitter regions for the NPN and PNP devices are then opened. A layer of undoped polysilicon is then deposited over the substrate. Arsenic is then implanted and driven into the NPN emitter region. Boron or $BF_2$ is implanted into the PNP emitter region. The polysilicon layer is then etched to define the emitter regions for the two devices. A layer of oxide is deposited and a final rapid thermal anneal is used to activate the junctions. Contact regions are opened and a metallization step is used to provide the contacts.

Further objects and advantages of the present invention will become apparent from the following detailed description and accompanying drawings.

BRIEF DESCRIPTION OF THE DRAWINGS

FIGS. 1(a) through 1(j) are cross-sectional views showing the process flow for forming complementary bipolar transistors on a common substrate according to the method of the present invention.

DETAILED DESCRIPTION OF THE INVENTION

Figure 1A:
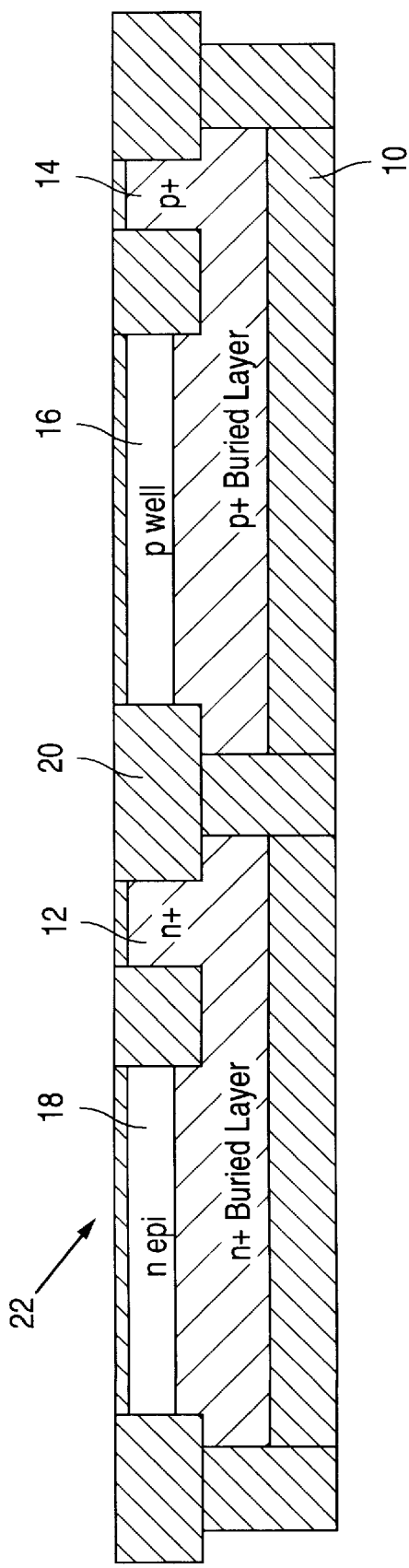

FIGS. 1(a) through 1(j) are cross-sectional views showing the process flow for forming complementary bipolar transistors on a common substrate according to the method of the present invention. As shown in FIG. 1(a), the complementary NPN and PNP devices are formed in a common silicon substrate (not shown) on which a layer of oxide is deposited 10. Sinker, well, and buried layer regions for the NPN and PNP devices are formed according to methods well known in the semiconductor industry. An N+ doped buried layer 12 which will be used to form the collector of the NPN device is formed on one side of the top surface of substrate/oxide structure 10. Similarly, a P+ doped buried layer 14 which will be used to form the collector of the PNP device is formed on the other side of the top surface of substrate/oxide structure 10. P-well 16 and n-type epitaxial silicon 18 layers are then formed in the appropriate sides of the top surface of substrate/oxide structure 10, as shown in the figure. Planar shallow and/or deep trench isolation structures 20 are then formed as desired to isolate the active device regions. A layer of oxide 22 is then deposited or grown over the top surface of substrate/oxide structure 10. Oxide layer 22 is typically 500 Å thick.

A photoresist mask is then used to define and open the NPN device base region by wet-etching of oxide layer 22 to remove it from n-type epitaxial silicon region 18. A P+ doped silicon-germanium (SiGe) base region stack is then grown over the surface of substrate/oxide structure 10 using an epitaxial growth process. The process used may be one of several well known in the semiconductor industry. An epitaxial growth process provides control of the film thickness and composition, producing a more abrupt transition between different material layers. This allows a desired doping profile to be more readily achieved, resulting in better, and more closely matched performance of the final devices.

Figure 1B:
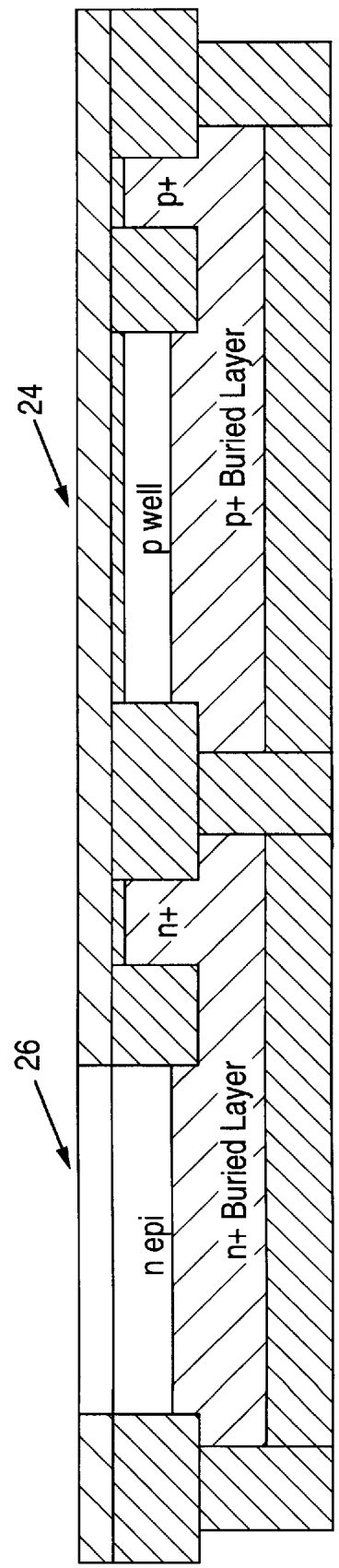

The SiGe base region stack is formed from an intrinsic or doped silicon layer arranged over an undoped SiGe layer, which is arranged over a layer of P+ doped SiGe. The silicon layer is typically 150–350 Å thick and if doped, is done so to a dose of 1 to $5 \times 10^{16}$ ions/$cm^2$. The undoped SiGe layer is typically 350 Å thick. The P+ doped SiGe is typically 800 Å thick and is described by the chemical formula $Si_xGe_{1-x}$, where x varies from 0.8 to 0.9. The P+ SiGe stack will be used to form the base region of the NPN device. The portions of P+ SiGe stack 24 grown over oxide layer 22 will form poly-crystalline SiGe at the oxide/SiGe interface, while the portions of P+ SiGe stack 26 grown over epitaxial silicon layer 18 will form single crystalline SiGe at the epitaxial silicon/SiGe interface. The resulting structure is shown in FIG. 1(b).

Boron is then implanted into the extrinsic base contact regions 28 for the NPN device. This is performed using well known masking and dopant implant methods. A typical implant dose would be $5 \times 10^{14}$ to $5 \times 10^{15}$ ions/$cm^2$. A photoresist mask is then used to protect the NPN base and contact regions and permit reactive ion etching of the P+ SiGe stack, thereby removing the P+ SiGe stack from the top surface of the substrate except in those regions protected by the resist. A 500 Å thick layer of oxide 30 is then deposited over the surface of substrate/oxide structure 10. The resulting structure is shown in FIG. 1(c).

A photoresist mask is then used to pattern and wet etch oxide layer 30, removing those portions of layer 30 covering the region in which the PNP device will be formed, i.e., removing it from over p well region 16. The PNP device base region is then formed from an N+ SiGe stack, in a similar manner to the use of a P+ SiGe stack to form the NPN device base region.

As is well known, because oxide layer 30 has been removed from the region in which the PNP device base is to be formed from the N+ SiGe stack, a thin, native oxide layer 31 (shown in FIG. 1(d)) will grow in that region. Native oxide 31 results from exposure of the surface of p well region 16 to the ambient atmosphere, causing oxidation of the surface and the formation of a thin oxide layer. In order to continue with the processing of the PNP device region to form the base region, the native oxide must be removed. Thus, prior to growth of the N+ SiGe base layer, a low temperature process is used to etch the portions of the native oxide layer covering p well 16. This low temperature process is used to remove native oxide layer 31 without causing a relaxation of the NPN transistor SiGe base layer (s). The low temperature process also prevents a diffusion of the dopant out of the NPN base layer(s). Low temperature etch processes suitable for use in practicing the present invention include: (1) a low temperature (<900° C.) prebake; (2) an in-situ vapor HF etch; (3) an in-situ plasma etch; (4) a low pressure gaseous etch; or (5) a hydrogen passivation process.

After removal of native oxide layer 31, an N+ doped silicon-germanium base region stack is epitaxially grown over the surface of the substrate. The stack is formed from an intrinsic or doped silicon layer arranged over an undoped SiGe layer, which is arranged over a layer of N+ doped SiGe. The silicon layer is typically 150–350 Å thick and if doped, is done so to a dose of 1 to $5 \times 10^{16}$ ions/$cm^2$. The undoped SiGe layer is typically 350 Å thick. The P+ doped SiGe is typically 800 Å thick and is described by the chemical formula $Si_xGe_{1-x}$, where x varies from 0.8 to 0.9. As discussed, the N+ SiGe stack will be used to form the base region of the PNP device. The portions of N+ SiGe stack 32 grown over oxide layer 30 will form poly-crystalline SiGe at the oxide/SiGe interface, while the portions of N+ SiGe stack 34 grown over p well 16 will form single crystalline SiGe at the p well/SiGe interface. The resulting structure is shown in FIG. 1(e).

After the low temperature pre-clean and growth of the N+ SiGe layer, Phosphorus is implanted into the extrinsic base contact regions 36 for the PNP device. This is performed using well known masking and dopant implant methods. A typical implant dose would be $5 \times 10^{14}$ to $5 \times 10^{15}$ ions/cm$^2$. A photoresist mask is then used to protect the PNP base and contact regions and permit reactive ion etching of the N+ SiGe stack, thereby removing the N+ SiGe layer from the top surface of the substrate except in those regions protected by the resist.

Figure 1G:
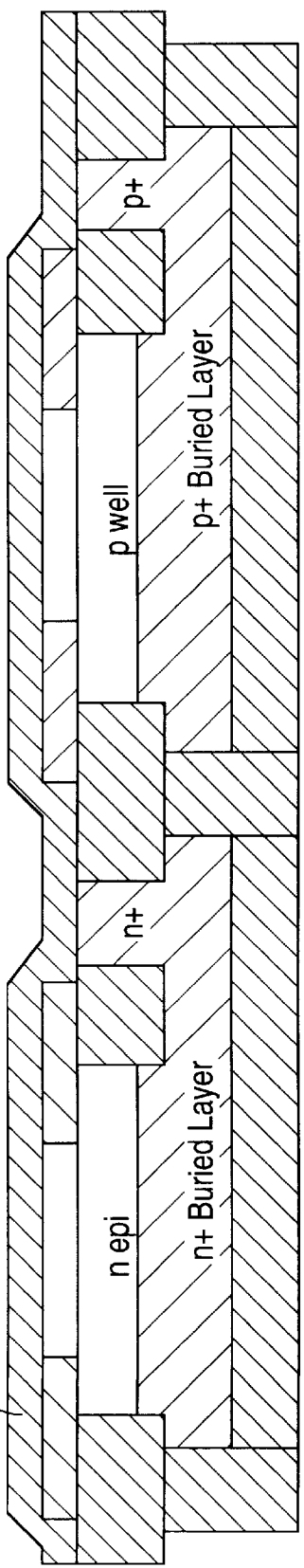

The portions of oxide layer 30 (see FIG. 1(d)) covering the top of the base region (the P+ SiGe layer) of the NPN transistor are then removed by a wet etch process. The resulting structure is shown in FIG. 1(f). A layer of oxide 38 is then deposited over the surface of the substrate. The resulting structure is shown in FIG. 1(g).

The emitter regions for the NPN and PNP devices are then defined and opened in oxide layer 38. A layer of undoped polysilicon 40 is then deposited over the surface of the substrate. A photoresist mask is then used to define the NPN emitter region and Arsenic 42 is implanted into this region, thereby doping the portion of polysilicon layer 40 which forms the NPN emitter. The photoresist layer is then removed. A low temperature furnace drive-in step is then used to activate the Arsenic implant.

Figure 1H:
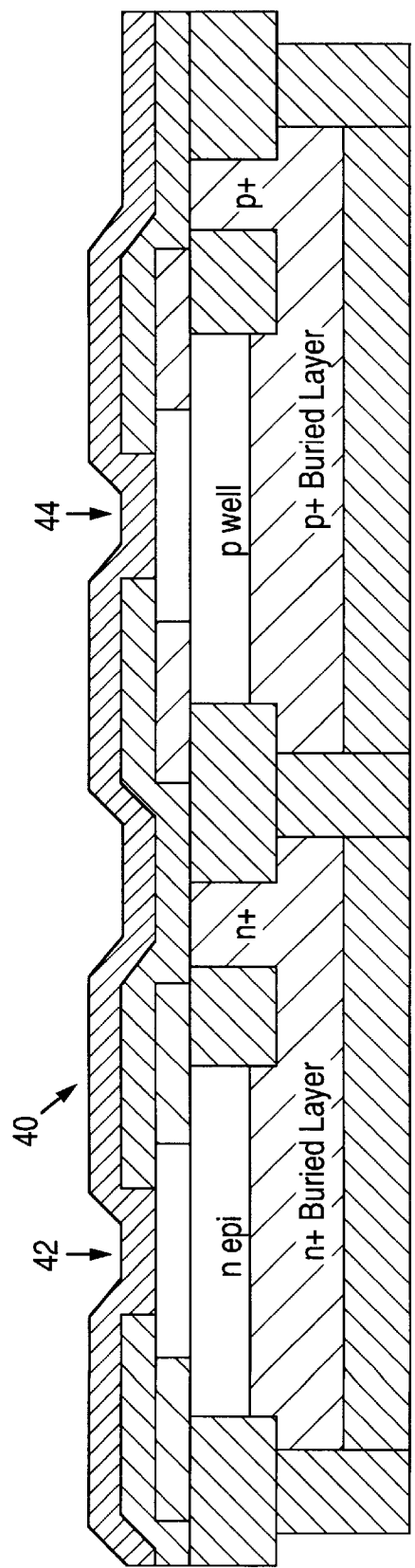

A new layer of photoresist is then deposited over the substrate. The photoresist layer is then patterned to form a photoresist mask which defines the PNP emitter region. Boron or BF$_2$ 44 is then implanted into the PNP emitter region, thereby doping the portion of polysilicon layer 40 which forms the PNP emitter. The resulting structure is shown in FIG. 1(h).

Figure 1I:
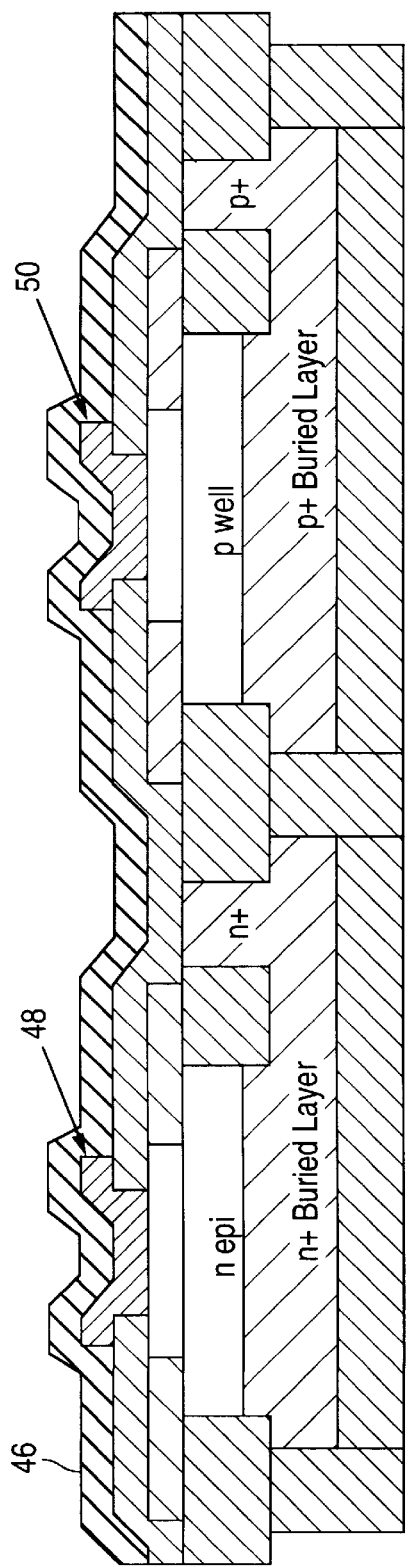

Polysilicon layer 40 is then etched to define the emitter regions. This removes those portions of layer 40 which are not used to form the emitters for the NPN and PNP devices. A layer of oxide 46 is then deposited over the surface of the substrate. A final rapid thermal anneal (RTA) step is then used to activate the emitter-base junctions. The NPN device has an N+ doped polysilicon emitter region 48, while the PNP device has a P+ doped polysilicon emitter region 50. The resulting structure is shown in FIG. 1(i).

Figure 1J:
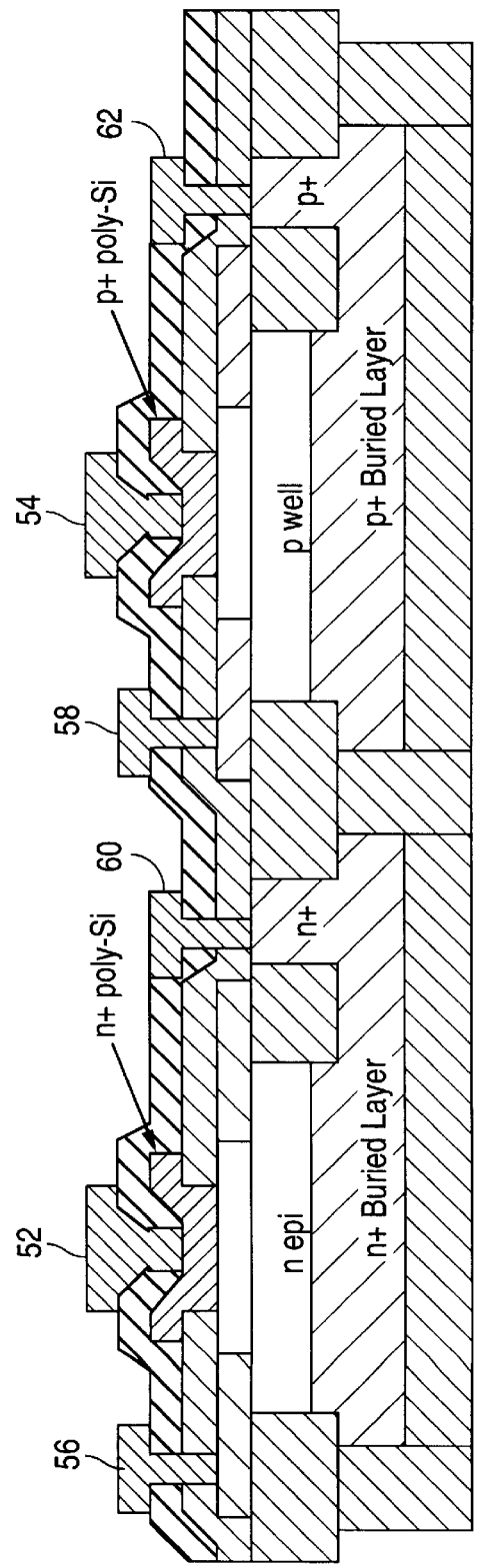

Contacts for the emitter (elements 52 and 54), base (elements 56 and 58), and collector (elements 60 and 62) regions of the NPN and PNP devices are then defined and opened by removing the appropriate portions of oxide layer 46. A metallization step is then used to form the contacts. The resulting structure is shown in FIG. 1(j).

Figure 2:
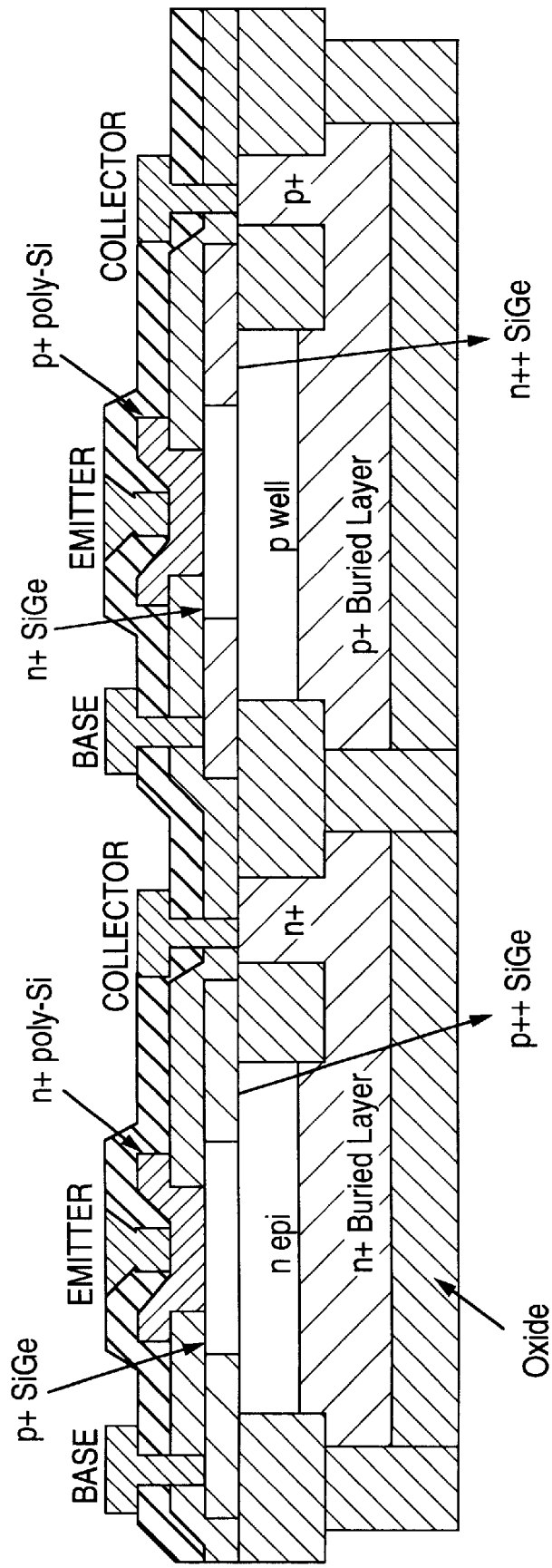
FIG. 2 is cross-sectional view showing the complementary NPN and PNP devices formed according to the method of the present invention.

FIG. 2 is cross-sectional view showing the complementary NPN 64 and PNP 66 devices formed according to the method of the present invention. As shown in the figure, both devices have the same structure and layout, and the same vertical emitter-base-collector configuration. Thus, both devices operate in the same downward mode.

The process described produces truly complementary bipolar devices suited for use in high performance, low noise, and high frequency applications. The devices have a low extrinsic base resistance due to the use of the highly doped SiGe layers which are used to form the base regions for the devices. The use of SiGe permits improved performance to be obtained by means of bandgap engineering of the material. This results in the formation of heterojunction bipolar transistors (HBT). The inventive process uses doped polysilicon layers to form the emitters of both devices.

Because the two devices are formed using separate base region stacks, the devices' characteristics can be optimized independently of each other. Thus, for example, the respective SiGe base stacks of the NPN and PNP devices may be individually grown with a desired dopant concentration. The inventive process utilizes a low temperature pre-clean step prior to formation of the PNP device base region to remove any native oxide formed on that region of the substrate. This prevents relaxation of or dopant diffusion from the NPN device base layers, a potential problem which arises because of the use of doped SiGe to form the base layers. The use of the low temperature native oxide removal step allows the fabrication of truly complementary bipolar transistors having the enhanced performance characteristics (e.g., low extrinsic base resistance) which can be obtained by using silicon-germanium as part of the base region. The use of an epitaxial growth process to form the base layer stacks permits better control of the material layers' thicknesses and compositions. This results in a more abrupt transition between different layers and the ability to form closely matched, high performance, complementary bipolar devices.

The inventive process can also be used to form n- and p-type low value polysilicon resistors and poly/LTO/metal capacitor structures. In order to form resistor structures, a photoresist mask is used to selectively implant the polysilicon layer used to form the emitters for the NPN and PNP devices. Capacitor structures may be formed from arranging a layer of polysilicon or SiGe over the oxide/polysilicon layers in the emitter regions, or from arranging layers of metal and oxide over the polysilicon emitter regions.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method for forming complementary bipolar transistors on a common substrate, wherein the substrate has been selectively formed to have an N type epitaxial silicon layer formed in an N+ type buried layer in an NPN device region and a P type well formed in a P+ type buried layer in a PNP device region, the NPN and PNP device regions being separated by an isolation structure, the method comprising:

arranging a layer of material of a first conductivity type over the surface of the substrate;

removing the material of the first conductivity type from those regions of the substrate surface which are not part of the NPN device region;

depositing a layer of oxide over the surface of the substrate;

removing the portions of the oxide layer which cover the substrate in the PNP device region;

removing a native oxide layer from the PNP device region of the substrate by performing an etch process which doesn't cause a relaxation of the layer of material of the first conductivity type;

arranging a layer of material of a second conductivity type over the surface of the substrate;

removing the material of the second conductivity type from those regions of the substrate surface which are not part of the PNP device region; and completing the processing of the NPN and PNP devices, including forming the emitter regions and contacts for the devices.

2. The method of claim 1, wherein after the step of removing the material of the first conductivity type from those regions of the substrate surface which are not part of the NPN device region, the method further comprises;

implanting a dopant into an extrinsic base contact region of the NPN device.

3. The method of claim 1, wherein after the step of removing the layer of material of the second conductivity type from those regions of the substrate surface which are not part of the PNP device region, the method further comprises;

implanting a dopant into an extrinsic base contact region of the PNP device.

4. The method of claim 1, wherein the step of arranging the layer of material of the first conductivity type further comprises:

arranging a layer of silicon-germanium (SiGe) over the surface of the substrate; and doping the silicon-germanium layer to be P+ type.

5. The method of claim 1, wherein the step of arranging the layer of material of the second conductivity type further comprises:

arranging a layer of silicon-germanium (SiGe) over the surface of the substrate; and doping the silicon-germanium layer to be N+ type.

6. The method of claim 1, wherein the step of removing the native oxide layer further comprises:

performing a low temperature (<900° C.) pre-bake.

7. The method of claim 1, wherein the step of removing the native oxide layer further comprises:

performing an in-situ vapor HF etch.

8. The method of claim 1, wherein the step of removing the native oxide layer further comprises:

performing an in-situ plasma etch.

9. The method of claim 1, wherein the step of removing the native oxide layer further comprises:

performing a low pressure gaseous etch.

10. The method of claim 1, wherein the step of removing the native oxide layer further comprises:

performing a hydrogen passivation process.

11. A method for forming complementary bipolar transistors on a common substrate, wherein the substrate has been selectively formed to have an N type epitaxial silicon layer formed in an N+ type buried layer in an NPN device region and a P type well formed in a P+ type buried layer in a PNP device region, the method comprising:

depositing a first layer of oxide over the substrate;

removing the first oxide layer from the NPN device region of the substrate;

forming a layer of P+ doped silicon-germanium (SiGe) over the substrate;

implanting Boron into the P+ SiGe layer in an extrinsic base contact region of the NPN device;

etching the P+ SiGe layer to remove it from regions of the substrate which are not part of the NPN device region;

depositing a second layer of oxide over the substrate;

removing the second oxide layer from the PNP device region of the substrate;

removing a native oxide layer from the PNP device region of the substrate by performing an etch process which doesn't cause a relaxation of the P+ SiGe layer;

forming a layer of N+ doped silicon-germanium over the substrate;

implanting Phosphorous into the N+ SiGe layer in an extrinsic base contact region of the PNP device;

etching the N+ SiGe layer to remove it from regions of the substrate surface which are not part of the PNP device region;

removing any remaining portions of the second oxide layer;

depositing a third layer of oxide over the substrate;

opening emitter regions for the NPN and PNP devices;

depositing a layer of polysilicon over the substrate;

implanting dopants into the emitter regions for the NPN and PNP devices;

etching the layer of polysilicon to remove it from regions of the substrate which are not part of the NPN and PNP emitter regions;

activating the emitter junctions; and forming contacts to the NPN and PNP devices.

12. The method of claim 11, wherein the step of removing the native oxide layer further comprises:

performing a low temperature (<900° C.) pre-bake.

13. The method of claim 11, wherein the step of removing the native oxide layer further comprises:

performing an in-situ vapor HF etch.

14. The method of claim 11, wherein the step of removing the native oxide layer further comprises:

performing an in-situ plasma etch.

15. The method of claim 11, wherein the step of removing the native oxide layer further comprises:

performing a low pressure gaseous etch.

16. The method of claim 11, wherein the step of removing the native oxide layer further comprises:

performing a hydrogen passivation process.

17. A method for forming complementary bipolar transistors on a common substrate, wherein the substrate has been selectively formed to have an N type epitaxial silicon region formed in an N+ type buried layer in an NPN device region and a P type well formed in a P+ type buried layer in a PNP device region, the method comprising:

forming a base region for the NPN device from a layer of silicon germanium which is doped to have a P+ conductivity type;

removing a native oxide layer from the PNP device region of the substrate by performing an etch process which doesn't cause a relaxation of the P+ type NPN base region;

forming a base region for the PNP device from a layer of silicon germanium which is doped to have an N+ conductivity type; and completing the processing of the NPN and PNP devices, including forming the emitter regions and contacts for the devices.

18. The method of claim 17, wherein the step of removing the native oxide layer further comprises:

performing a low temperature (<900° C.) pre-bake.

19. The method of claim 17, wherein the step of removing the native oxide layer further comprises:

performing an in-situ vapor HF etch.

20. The method of claim 17, wherein the step of removing the native oxide layer further comprises:

performing an in-situ plasma etch.

21. The method of claim 17, wherein the step of removing the native oxide layer further comprises:

performing a low pressure gaseous etch.

22. The method of claim 17, wherein the step of removing the native oxide layer further comprises:

performing a hydrogen passivation process.

\* \* \* \* \*